United States Patent
De Graaf et al.

(10) Patent No.: US 8,513,691 B2
(45) Date of Patent: Aug. 20, 2013

(54) LIGHT EMITTING DEVICE INCLUDING REFLECTIVE OPTIC HOUSING AT LEAST PARTIALLY FILLED WITH REFLECTIVE MATERIAL

(75) Inventors: Jan De Graaf, Uden (NL); Marten Sikkens, Nuenen (NL); Josef A. Schug, Wuerselen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/124,401

(22) PCT Filed: Oct. 8, 2009

(86) PCT No.: PCT/IB2009/054410
§ 371 (c)(1),
(2), (4) Date: Apr. 15, 2011

(87) PCT Pub. No.: WO2010/044023
PCT Pub. Date: Apr. 22, 2010

(65) Prior Publication Data
US 2011/0198655 A1  Aug. 18, 2011

(30) Foreign Application Priority Data
Oct. 17, 2008 (EP) .................... 08166857

(51) Int. Cl.
*H01L 33/60* (2010.01)

(52) U.S. Cl.
USPC ................... 257/98; 257/E33.001

(58) Field of Classification Search
USPC ............. 257/98, 99, 100, E33.001, E33.072
See application file for complete search history.

(56) References Cited

U.S. PATENT DOCUMENTS

| 6,274,890 B1 * | 8/2001 | Oshio et al. .................. 257/98 |
| 6,710,377 B2 * | 3/2004 | Shimomura ................... 257/99 |
| 7,253,448 B2 | 8/2007 | Roberts et al. |
| 2003/0071568 A1 | 4/2003 | Lowery et al. |
| 2004/0124429 A1 | 7/2004 | Stokes et al. |
| 2005/0190561 A1 * | 9/2005 | Ng et al. ...................... 362/307 |
| 2006/0187653 A1 | 8/2006 | Olsson |
| 2007/0170454 A1 | 7/2007 | Andrews |
| 2008/0094835 A1 | 4/2008 | Marra et al. |

FOREIGN PATENT DOCUMENTS

| EP | 1512578 A1 | 3/2005 |
| WO | 03038912 A2 | 5/2003 |

* cited by examiner

*Primary Examiner* — Bilkis Jahan
(74) *Attorney, Agent, or Firm* — Mark L. Beloborodov

(57) ABSTRACT

The present invention relates to a light emitting device (100) comprising at least one light emitter (101), a substrate (102) and a reflective optic housing (103,108), the space between the reflective optic housing (103,108) and the one or more light emitters (101) being filled at least partly by a suspension of a reflective material (104), in order to increase the light output from the light emitter(s) (101).

6 Claims, 4 Drawing Sheets

LIGHT EMITTING DEVICE INCLUDING REFLECTIVE OPTIC HOUSING AT LEAST PARTIALLY FILLED WITH REFLECTIVE MATERIAL

FIELD OF THE INVENTION

The invention relates to the field of light emitting devices, and more specifically to an improvement of the light output thereof.

BACKGROUND OF THE INVENTION

Light-emitting devices, according to the above field of invention, are known conventionally. They are used as light sources where a beam performance is required, which can be obtained by collimating the light. This is in devices such as automotive headlights/taillights, light emitting diodes (LED) mini beamers, spotlights and colortunable LED sources, where mixing of the emission from the individual dies is required for application. A light emitting device of this type is described in US 2008/0094835, where a light engine comprising a chamber with at least one aperture, and a number of led elements positioned inside this chamber, where effectively all inner surfaces of the chamber are realized as high-reflective surfaces, by sandwiching dry powder between the inside surfaces of the wall and a transparent covering plate.

The approach in US 2008/0094835 involving the use of dry powders, result in a need for binding means, such as a covering plate. This may require for example holes in the covering plate or an outcoupling element. Furthermore, in order to obtain a highly reflective surface, the powder layer needs to be 2-3 mm. There is also a risk that the powder will not be dispersed properly, and areas where the powder layer may be thinner, and thus does not disperse the light sufficiently enough. Hence, there exists a need for an improved light emitting device.

SUMMARY OF THE INVENTION

It would be advantageous to achieve a light emitting device with improved light output. It would also be desirable to enable a more easily manufactured light emitting device. Furthermore, it would also be desirable to enable a light emitting device requiring less material consumption. It is an object of the present invention to overcome these problems, and to provide a light emitting device where the light output is improved.

Furthermore, the invention addresses the aspect that a direct view on the substrate next to the light emitting device may create a dark stripe due to the low reflectivity of many substrates. These dark stripes can create artifacts if the light source is directly imaged or projected as e.g. in automotive headlamp applications.

To better address one or more of these concerns, in a first aspect of the invention a light emitting device is presented that comprises at least one light emitter arranged on a substrate and a reflective optic housing at least partly laterally surrounding the at least one light emitter, wherein a space between the reflective optic housing and the at least one light emitter is filled at least partly by a suspension of a reflective material. In many light emitting constructions, e.g. a thick LED, or a thin film flip chip (TFFC) with a thick ceramic tile with embedded phosphor particles (in this application referred to as Lumiramic or Lumiramic tile) on top, light is emitted from the sides. One effect of the suspension is to reflect light emitted in non-desirable directions, such as to the sides, which otherwise would be partly absorbed by the substrate and not collimated or mixed properly, with an efficiency loss as a result. Hence, the suspension reflects light emitted from the light emitter. Thus, the light may be reflected back into the light emitter. As an advantage, the light output from the top surface of the light emitter is then increased. An advantage of using a suspension together with a reflective optic housing for collimation, color mixing and/or light concentration at the package level, also called level 2, is that it is optically efficient, more light is reflected, than when the light rays are at least partly absorbed by the substrate. The suspension of a reflective material may be used to reflect this light that is emitted from the side of the light emitter, back into the light emitter, where it eventually will escape from the top surface. Furthermore the suspension protects the dies from touching while handling the module. A suspension is easy to disperse in the space between the light emitter(s) and the wall of the reflective optic housing. In case of more light emitters in the same reflective optic housing, the suspension of a reflective material avoids "cross-talk", between light emitters i.e. light coming from one light emitter going into another light emitter. If addressable light emitters were used, there would be a light emitted from light emitters that are not addressed, because no kind of barrier is used between the addressed and non-addressed light emitters, and this would be unwanted. By using the a suspension of a reflective material, this cross talk is avoided. Furthermore the suspension of the reflective material creates a mechanical robustness that works like extra support to keep e.g. a Lumiramic tile and a TFFC together and fixed to the substrate. The suspension of the reflective material may also improve the heat conduction between the light emitter and/or die and/or Lumiramic and/or TFFC and the substrate. The suspension of the reflective material furthermore seals the light emitter and its electrical contacts from the environment. The suspension of the reflective material may additionally eliminate possible short-circuit paths along the sides of the light emitter caused by moisture, pollution etc.

According to an embodiment of the invention a light emitting device may further comprise at least one channel suitable for application of a reflective material. An advantage of a channel is that it allows of convenient application of the reflective material for example by injection. The reflective material may also be applied in other ways, so that the side(s) of the light emitters/dies/TFFC/Lumiramics is surrounded by a reflective material.

According to an embodiment of the invention a light emitting device may further comprise a channel, which is formed in the reflective optic housing, in the substrate or in an intersection between the interface of the substrate and the reflective optic housing. An advantage of this is that the channel(s) may be placed were it is most suitable. This may depend on the production technique. If e.g. the device, or parts of it, is produced by layer etching the channel may be etched into the substrate as an alternative. The suspension may also be applied from the top.

According to an embodiment of the invention the light emitting device may comprise white-reflective optic housing or a specularly reflective optic housing or any combinations thereof. The specularly reflective optic housing may provide a better collimation of the light, while the white-reflective optic housing may provide better mixing of the light.

According to an embodiment of the invention, a light emitting device may comprise a reflective optic housing that constitutes a collimator, a concentrator, a color/light mixer or any combinations thereof. This makes it possible to control the etendue of the light for different applications.

According to an embodiment of the invention, a light emitting device wherein the reflective material comprises $TiO_2$, other reflective particles or any combinations thereof. The $TiO_2$ concentration or the concentration of other reflective particles may be at least 20% by volume in order to give the suspension a desired reflectance. The suspension may be clear with a an amount of highly reflective particles with a spectrally neutral character. This may provide the suspension with good reflective qualities. Other reflective materials that may be used for particles include $BaSO_4$, $Al_3O_3$, MgO, Ca-halophosphate, Ca-pyrophosphate and/or $YBO_3$.

According to an embodiment of the invention a light emitting device may comprise a reflective material that extends from the substrate to at least 50% of the height of the light emitter, extends preferably from the substrate to at least 75% of the height of the light emitter, extends more preferably from the substrate to at least 90% of the height of the light emitter, and extends most preferably from the substrate to at least 100% of the height of the light emitter. In other words the light emitting device may comprise a reflective material that covers essentially the side surfaces of the at least one light emitter, covers 50%, preferably 75%, more preferably 90%, most preferably 100% of the side surfaces of the at least one light emitter. An advantage is that the better the coverage, the better the mixing and/or collimating and/or reflection of the light. The height of the light emitter is defined as the part of the light emitter that stretches from substrate, up to the highest point of the light emitter or light emitting diode. Furthermore, approximate to the light emitter, a lumiramic tile may be arranged, in order to generate white light if a such is desired. The sides and the height of the light emitter(s) may include the lumiramic tile. The suspension of the reflective material may reach a higher point than the height of the light emitter, for example incline from the wall of the reflective optic housing towards the light emitter.

According to an embodiment of the invention, a light emitting device comprises at least one TFFC die. An advantage is that here there is no cathode/anode in the light path.

In a second aspect, the present invention relates to a method for the manufacture of a light emitting device, comprising: providing a substrate on which at least one light emitter is arranged; arranging a reflective optic housing at least partly laterally surrounding the at least one light emitter; filling a space between the reflective optic housing and the at least one light emitter with a suspension of a reflective material. Here no further binding means are required, to ensure that the reflective particles stay in place, as the binding means are present in form of the suspension. It is more controllable than a powder and requires few working steps.

One effect of the suspension is to reflect light emitted in non-desirable directions, such as to the sides, which otherwise would be partly absorbed by the substrate and not collimated or mixed properly, with an efficiency loss as a result. Hence, the suspension reflects light emitted from the light emitter. Thus, the light may be reflected back into the light emitter. As an advantage, the light output from the light emitter is then effectively increased. Furthermore the suspension protects the dies from touching while handling the module. A suspension is easy to disperse in the space between the light emitter(s) and the wall of the reflective optic housing. In case of more light emitters in the same reflective optic housing, the suspension of a reflective material avoids "cross-talk", between light emitters i.e. light coming from one light emitter going into another light emitter. If addressable light emitters were used, there would be a light emitted from light emitters that are not addressed, because no kind of barrier is used between the addressed and non-addressed light emitters and this would be unwanted. By using the a suspension of a reflective material, this cross talk is avoided. Furthermore the suspension of the reflective material creates a mechanical robustness that works like extra support to keep e.g. a Lumiramic tile and a thin film flip chip (TFFC) together and fixed to the substrate. The suspension of the reflective material may also improve the heat conduction between the die and/or Lumiramic and/or TFFC and the substrate. The suspension of the reflective material furthermore seals the die or TFFC or light emitter and its electrical contacts from the environment. The suspension of the reflective material may additionally eliminate possible short-circuit paths along the sides of the light emitter caused by moisture, pollution etc.

According to an embodiment of the invention, the method may further comprise curing of the reflective material. By curing the suspension, no further layer or extra material is required to keep the reflective material in place. This provides for fewer work steps and provides a snug fit of the suspension around the die, thus dirt, dust, pollution or other unwanted materials may be prevented from affecting the reflectivity.

According to an embodiment of the invention, the method wherein the reflective optic housing is arranged by layer etching or produced by injection molding (e.g. with diffuse white plastic) or by etching the proper shape in the substrate including a reflective coating, and afterwards placing the light emitters or dies on the substrate, or by shaping a piece of metal, bending it into shape, the metal or coating on the metal being more or less specularly reflecting, or by any other known technique.

According to an embodiment of the invention, the method may further comprise injecting the reflective material through a channel in the reflective optic housing. This makes it possible to apply the reflective material exactly where it is required, around the sides of the light emitters so no material ends up on top of the light emitters thus blocking or reflecting the light in unwanted directions.

According to an embodiment of the invention, the method may comprise dispersing of the reflective material into the space between the reflective optic housing and the at least one light emitter by capillary force. This may secure optimal dispersion of the suspension thus avoiding air holes in the suspension and thus provide a good reflection of the light.

The light emitter may be in the form of a light emitting diode (LED), a TFFC die, a die, a flash LED or any other light emitting device.

The reflective optical housing is optional and may be excluded. In order to keep the suspension in place while fluid, a temporary installment that delimit the movement of the suspension, may be applied.

What is meant by " . . . space . . . is filled at least partly by a suspension . . . " or "filling" in the independent claims, is that parts of the space or room between the individual light emitters, and the wall(s) of the reflective optical housing may be filled, or partly filled, with a suspension. The important factor being that the more of the sides of the LED'(s) or light emitter(s) being covered, the more efficient reflection is obtained. Thus if the sides of the LED'(s) or light emitter(s) are fully covered, the best result is obtained. When using embodiments of the present invention several light emitter dies may be present within the circumference of the reflective optic housing. For example for an automotive headlamp module. A die is e.g. around 1 mm wide and 0.16 mm high. A linear array of 4 light emitter-dies in a headlamp module may be used and together with its beam-forming optics and a heatsink, the module may be around 50 mm wide and 75-100 mm in length. To form a complete Low Beam according to the official regulations, typically 2-3 of these units may be used.

Other formations comprising more or less light emitter dies forming linear, circular or another shape of formation may also be used.

It is noted that the invention relates to all possible combinations of features recited in the claims. That is, features mentioned in the first aspect, may be applied in the second aspect and vice versa.

These and other aspects of the invention will be apparent from and elucidated with reference to the embodiments described hereinafter. Generally, all terms used in the claims are to be interpreted according to their ordinary meaning in the technical field, unless explicitly defined otherwise herein. All references to "a/an/the/said [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

This and other aspects of the present invention will now be described in more detail, with reference to the appended drawings showing currently preferred embodiments of the invention.

The numbering applies throughout, that is the same numbers apply to the same elements.

DETAILED DESCRIPTION

FIGS. 1-9 shows various embodiments of a light emitting device according to the invention.

Figure 1:
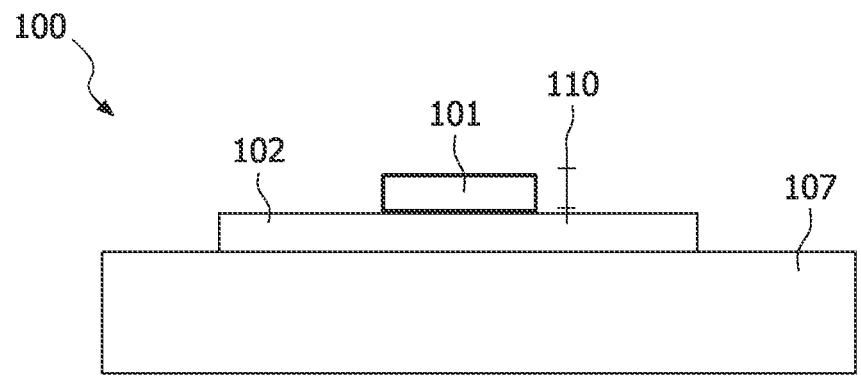
FIG. 1 is a schematic perspective view of a die or a die with a Lumiramic tile or LED on a substrate on a heatsink.
Figure 2:
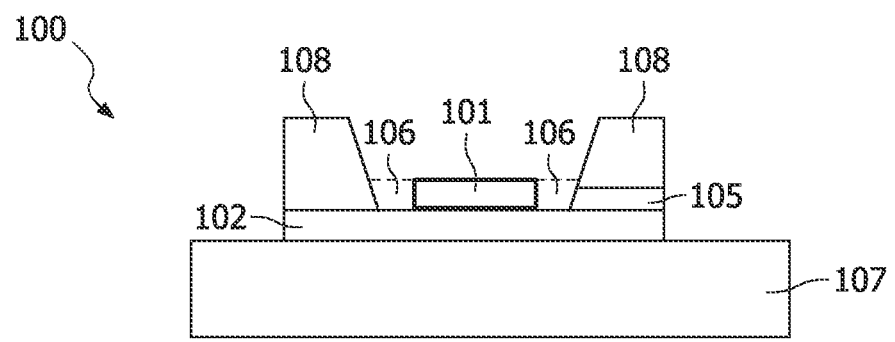
FIG. 2 is a schematic perspective view of a collimator on a substrate on a heatsink.
Figure 3:
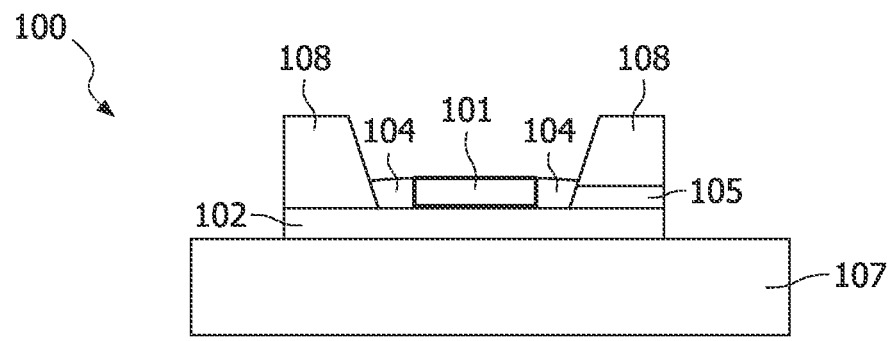
FIG. 3 is a schematic perspective view of a first embodiment of a collimator on a substrate on a heatsink.

FIGS. 1-3 represent steps of applying a suspension according to one embodiment of the invention.

Figure 4:
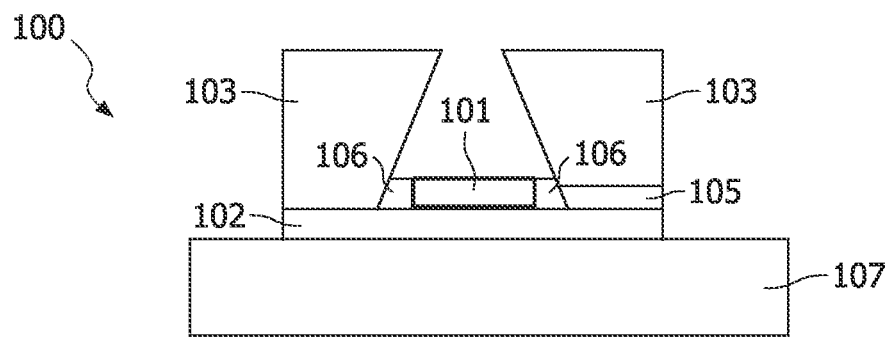
FIG. 4 is a schematic perspective view of a reflective concentrator/color and/or light mixer on a substrate on a heatsink according to an embodiment of the present invention.
Figure 5:
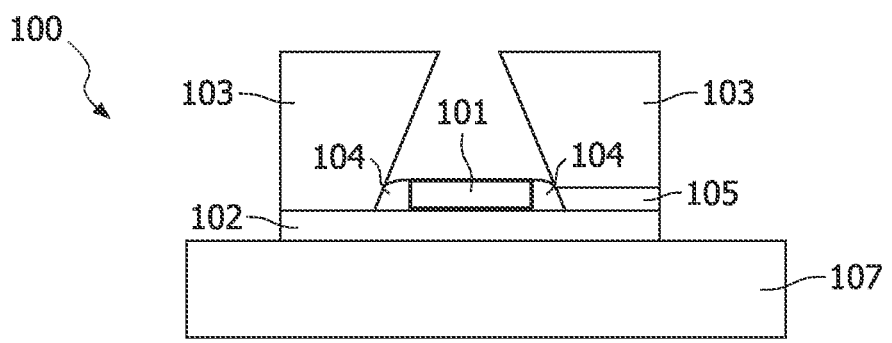
FIG. 5 is a schematic perspective view of a second embodiment of a reflective concentrator/color and/or light mixer on a substrate on a heatsink according to an embodiment of the present invention.

FIGS. 1, 4, 5 represent steps of applying a suspension according to another embodiment of the invention.

FIGS. 6-9 illustrates examples of light rays in various embodiments.

Figure 10:
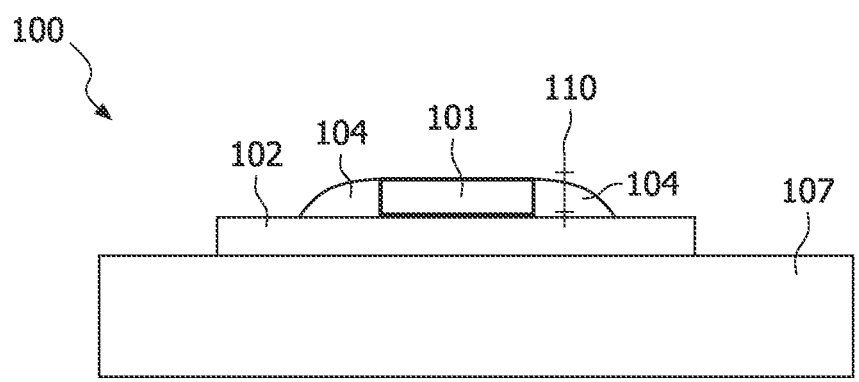
FIG. 10 is a schematic perspective view of a fifth embodiment.

FIG. 10 illustrates an alternative embodiment.

In FIG. 1, it is illustrated a schematic perspective view of light emitting device 100 with a die or light emitter 101 on a substrate 102 on a heatsink 107. This is the first step out of three steps of manufacturing of several embodiments of the invention. Here a light emitter 101 arranged on a substrate 102, which is arranged on a heatsink 107 is shown. Reference numeral 110 indicate the height of a light emitter, which may be from the highest point of the light emitter. In the subsequent steps this arrangement will be adapted for its specific purpose. This is commonly referred to as level one, may be LED dies on a substrate including contacting patterns etc. The subsequent drawings refer to level 2. Level 2 may comprise the package around an assembly, making it suitable for use in an application: protective housing including electrical, mechanical, thermal and optical interface to the external world.

In FIG. 2 a schematic perspective view of a reflective concentrator/color and/or light mixer on a substrate on a heatsink is illustrated. This is the second step and the step before FIG. 3 where the reflective material/suspension is applied. The light emitting device 100 of this embodiment comprises a light emitter 101 arranged on a substrate 102, which is arranged on a heatsink 107. In connection with the substrate 102, reflective optic housing—in this description also referred to as concentrator/color and/or light mixer or collimator—108 is arranged. The collimator 108 may be white reflective or be made of a material with high reflective performance such as a mirror, chromium, silver, aluminum or a lens. Furthermore the light emitting device 100 comprises a channel 105, or more channels. The one or more channel should be suitable for application of a suspension of a reflective material. The space 106 is illustrated as being enclosed by the walls of the collimator 108, the wall of the LED 101, the bottom of the substrate 102 and the dotted line stretching between the wall of the collimator to the top of the LED 101. The space 106 may also be a fraction of the space that is illustrated here. For example if the space is only partially filled, that is the bottom of the substrate 102 that is otherwise exposed, is covered, but the suspension does not stretch to the top of the LED.

In FIG. 3 a schematic perspective view of a first embodiment of a collimator 108 on a substrate 102 on a heatsink 107 is illustrated. This is the third step. Here the suspension/reflective material 104 has been applied.

In FIG. 4 a schematic perspective view of a reflective concentrator/color and/or light mixer on a substrate on a heatsink is illustrated. This is the second step before FIG. 5 where the reflective material/suspension is applied. The light emitting device 100 of this embodiment comprises a light emitter 101 arranged on a substrate 102, which is arranged on a heatsink 107. In connection with the substrate 102, a reflective optic housing—in this description also referred to as concentrator/color and/or light mixer or collimator—103 is arranged. The concentrator/color and/or light mixer 103 may be white reflective or be made of a material with high reflective performance such as a mirror, chromium, silver, aluminum or a lens. Furthermore the light emitting device 100 comprises a channel 105, or more channels. The one or more channels should be suitable for application of a suspension of a reflective material. The space 106 is illustrated as being enclosed by the walls of the concentrator/color and/or light mixer 103, the wall of the LED 101, the bottom of the substrate 102 and the dotted line stretching between the wall of the concentrator/color and/or light mixer 103 to the top of the LED 101. The space 106 may also be a fraction of the space that is illustrated here. For example if the space is only partially filled, that is the bottom of the substrate 102 that is otherwise exposed, is covered, but the suspension does not stretch to the top of the LED.

In FIG. 5 a schematic perspective view of a first embodiment of a concentrator/color and/or light mixer 103 on a substrate 102 on a heatsink 107 is illustrated. This is the third step of the second embodiment. Here the suspension/reflective material 104 has been applied.

For both FIGS. 3 and 5, the application may take place through the channel 105. With a suitable material the suspension/reflective material 104 may also be applied from above, where the light rays usually exits the device.

Figure 6:
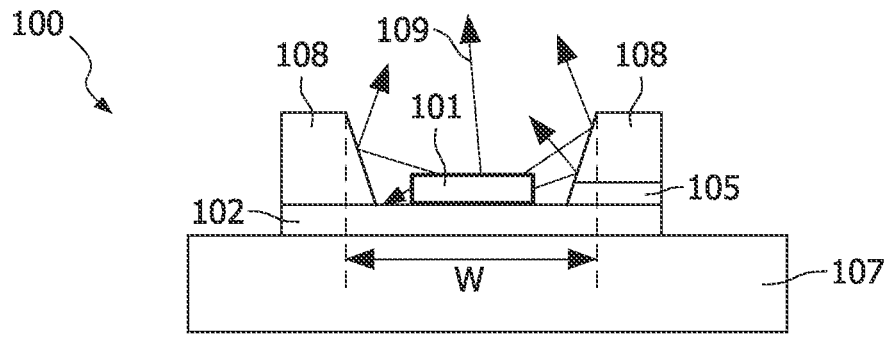
FIG. 6 is a schematic perspective view of an embodiment of a collimator on a substrate on a heatsink showing examples of light rays.

FIG. 6 illustrates what was illustrated on FIG. 2, but here examples of light rays 109 have been added. What it shows is that light exiting from the sides of the dies 101 is partly absorbed by the substrate 102 and, furthermore, makes the "effective" surface from which light travels upward have a width W.

Figure 7:
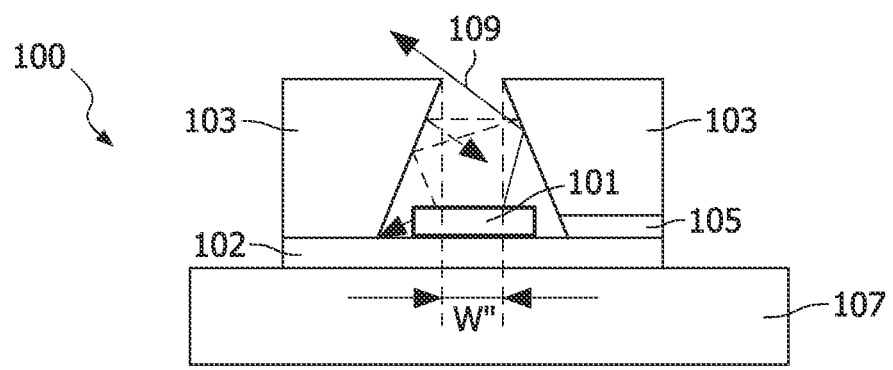
FIG. 7 is a schematic perspective view of a reflective concentrator/color and/or light mixer on a substrate on a heatsink showing examples of light rays.

FIG. 7 illustrates what was illustrated on FIG. 4 but here examples of light rays have been added. Here the width W" is reduced compared to the width on FIG. 6. Furthermore same issue is illustrated as on FIG. 6. The light rays 109 exiting from the sides of the die is being absorbed by the substrate and thus reduces the luminance or brightness, as less light rays 109 are leaving the reflective optic housing. The concentrator concentrates the light but some rays may stay inside the reflective optic housing as illustrated by the dashed lines.

Figure 8:
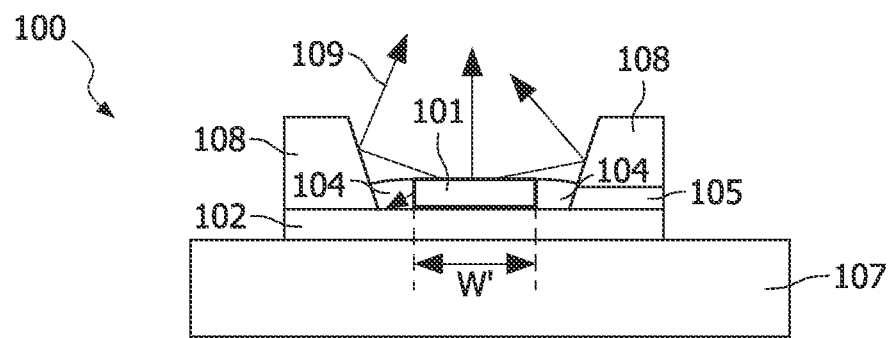
FIG. 8 is a schematic perspective view of a third embodiment of a collimator on a substrate on a heatsink according to an embodiment of the present invention showing examples of light rays.

FIG. 8 illustrates what was illustrated on FIG. 3 but here examples of light rays 109 have been added. Here the light rays 109 are being reflected in the suspension 104 and thus more light exits through the top of the collimator 108 resulting in a higher luminance.

Figure 9:
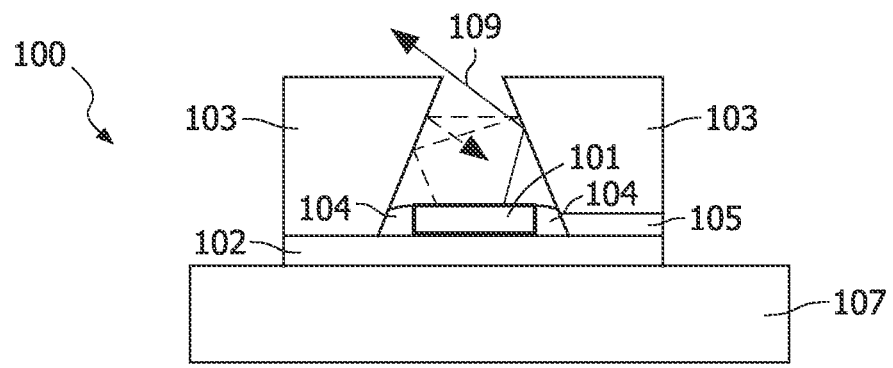
FIG. 9 is a schematic perspective view of a fourth embodiment of a reflective concentrator/color and/or light mixer on a substrate on a heatsink according to an embodiment of the present invention showing examples of light rays.

FIG. 9 illustrates what was illustrated on FIG. 5 but here examples of light rays 109 have been added. Here the suspension results in light rays exiting the side of the die are reflected and more light will exit the top of the concentrator/color and/or light mixer 103.

FIG. 10 illustrates an embodiment where only reflective material 104, which may me a suspension, is placed around the light emitter 101. Temporary means (not shown) for containing the reflective material, may be required since this embodiment contains no reflective optic housing, collimator or color/light mixer or concentrator. More than one light emitter 101 may be present.

When referring to "suspension", or "suspension of reflective material" or "reflective material" it is the same material that is being referred to. Other materials not necessarily constituting a suspension may also be used. What is important is its light reflecting capabilities.

The reflective materials or particles may be suspended in for example silicones or other clear or essentially clear materials.

When referring to channel, what is meant is a canal or a guide, which entry is placed on the outside of the collimator or concentrator or color and/or light mixer or substrate, and which exit is placed in the substrate between the wall of the reflective optic housing, which may be a collimator or concentrator or color and/or light mixer, and the LED or in the reflective optic housing at a level where the suspension is able to spread around the LED thus securing an optimal reflection of the light. The channel may be placed further up on the walls of the reflective optic housing if the suspension or material is capable of dispersing itself and provide the desired effects of reflection. The entry and/or the exit of the channel may have different shapes, such as round, square, triangular, oblong or any other shape. The light emitting device may also comprise two or more channels. This may provide for a more convenient distribution of the suspension to all desired areas.

Even though the reflective optic housing on the drawings does have a certain angle in relation to the substrate, the angle could vary between 1 degree and 179 degrees more preferably between 30 and 150 degrees depending on whether the light should be dispersed or concentrated. The walls could form an open or a partly closed cavity or combinations thereof, e.g. two opposing walls could be inclined towards each other whereas the other two walls could open up.

When referring to Lumiramic, what is meant is the material created through Lumiramic phosphor technology, which may reduce the number of fine bins at a given color temperature by 75 percent or more.

The person skilled in the art realizes that the present invention by no means is limited to the preferred embodiments described above. On the contrary, many modifications and variations are possible within the scope of the appended claims. For example, more than one, such as two or more, light emitters may be arranged within one and the same collimating or concentrating or color mixing structure. It is also understood that any feature from any embodiment may be used in another embodiment.

The invention claimed is:

1. A light emitting device comprising:
   at least one light emitter arranged on a substrate,
   a reflective optic housing disposed on said substrate at least partly laterally surrounding said at least one light emitter, and
   at least one channel formed between said substrate and said reflective optic housing, said channel connecting a space formed between said reflective optic housing and said at least one light emitter with an exterior of the reflective optic housing,
      wherein said space is at least partially filled a suspension of reflective material, and
      wherein said channel is shaped and dimensioned for delivering said suspension to said space by a capillary force.

2. A light emitting device according to claim 1, wherein said reflective optic housing is white-reflective, specularly reflective or any combinations thereof.

3. A light emitting device according to claim 1, wherein said reflective optic housing constitutes a collimator, a concentrator, a color and/or light mixer or any combinations thereof.

4. A light emitting device according to claim 1, wherein said reflective material comprises $TiO_2$.

5. A light emitting device according to claim 1, wherein said reflective material extends from said substrate to at least 50% of a height of said light emitter.

6. A light emitting device according to claim 1, wherein said light emitting device comprises at least one thin film flip chip (TFFC) die.

* * * * *